United States Patent
Schulz

(10) Patent No.: US 10,161,765 B2
(45) Date of Patent: Dec. 25, 2018

(54) CAPACITIVE SENSOR, THE ASSOCIATED EVALUATION CIRCUIT AND ACTUATOR FOR A MOTOR VEHICLE

(71) Applicant: IFM ELECTRONIC GMBH, Essen (DE)

(72) Inventor: Jörg Schulz, Tettnang (DE)

(73) Assignee: IFM ELECTRONIC GMBH, Essen (DE)

( * ) Notice: Subject to any disclaimer, the term of this patent is extended or adjusted under 35 U.S.C. 154(b) by 33 days.

(21) Appl. No.: 15/506,382

(22) PCT Filed: Aug. 20, 2015

(86) PCT No.: PCT/EP2015/069101
§ 371 (c)(1),
(2) Date: Feb. 24, 2017

(87) PCT Pub. No.: WO2016/030259
PCT Pub. Date: Mar. 3, 2016

(65) Prior Publication Data
US 2017/0254674 A1    Sep. 7, 2017

(30) Foreign Application Priority Data
Aug. 26, 2014    (DE) .................. 10 2014 216 998

(51) Int. Cl.
*G01D 5/24* (2006.01)
*H03K 17/955* (2006.01)
*H03K 17/96* (2006.01)

(52) U.S. Cl.
CPC ............ *G01D 5/24* (2013.01); *H03K 17/955* (2013.01); *H03K 17/9622* (2013.01)

(58) Field of Classification Search
CPC ............................. H03K 17/955; G01D 5/24
See application file for complete search history.

(56) References Cited

U.S. PATENT DOCUMENTS

| 7,804,307 B1 | 9/2010 | Bokma et al. |
| 8,217,666 B2 * | 7/2012 | Hagimoto ................ G01D 5/24 324/658 |
| 2008/0303536 A1 * | 12/2008 | Uhov ................... H03K 17/962 324/676 |

FOREIGN PATENT DOCUMENTS

| AT | 4032138 B | 12/1997 |
| DE | 102006020301 | 9/2006 |

(Continued)

OTHER PUBLICATIONS

International Search Report and Written Opinion Form PCT/ISA/220, International Application No. PCT/EP2015/069101, p. 1-7, International Filing Date Aug. 20, 2015, dated Nov. 11, 2015.

(Continued)

*Primary Examiner* — Jermele M Hollington
*Assistant Examiner* — Suresh K Rajaputra
(74) *Attorney, Agent, or Firm* — Bond Schoeneck & King, PLLC; George McGuire

(57) ABSTRACT

The invention relates to a capacitive sensor, the associated evaluation circuit and an actuator for a motor vehicle having the above-mentioned sensor for detecting the distance, speed, or position of an object, having a reference capacitance and two measuring capacitances, wherein a square-wave voltage is applied to the reference capacitance and the measuring capacitances via a resistor and a pulse which has a variable period and represents a measure of the particular measuring capacitance is obtained with the aid of a switching stage.

5 Claims, 2 Drawing Sheets

(56) References Cited

FOREIGN PATENT DOCUMENTS

| DE | 102007038225 | 2/2009 |
| DE | 102012106526 | 1/2014 |
| DE | 102012224007 | 6/2014 |
| EP | 1341306 | 9/2003 |
| WO | 2007/025785 | 8/2007 |

OTHER PUBLICATIONS

IEEE Transactions on Biomedical Circuits and Systems, vol. 4, No. 6, Dec. 2010; A Miniature-Implantable RB-Wireless Active Glaucoma Intraocular Pressure Monitor; Eric Y. Chow; pp. 340-349.

* cited by examiner

CAPACITIVE SENSOR, THE ASSOCIATED EVALUATION CIRCUIT AND ACTUATOR FOR A MOTOR VEHICLE

CROSS-REFERENCE TO RELATED APPLICATION

This application is the U.S. National Stage filing under 35 U.S.C. 371 of international application number PCT/EP2015/069101, filed on Aug. 20, 2015, the entire disclosure of each of which is incorporated herein by reference.

BACKGROUND OF THE INVENTION

The invention relates to a capacitive sensor, an associated evaluation circuit and an actuator for a motor vehicle according to the preambles of claims 3, 1 and 4.

Capacitive sensors are widespread not only in automation technology, but more recently also in the automotive industry, where they find application, inter alia, as a trunk or door opening or seat occupancy recognition.

DE 10 2012 106 526 A1 discloses a capacitive door handle sensor for a motor vehicle comprising at least two electrodes with different monitoring areas, wherein an electrode acts as a reference electrode (reference capacitance).

DE 10 2012 224 007 A1 discloses an arrangement and a method for converting the capacity of a measuring capacitor into a voltage which is detectable by an analog-digital converter comprising a charge transfer device for transferring the charge of an unknown capacitance $C_x$ to a measuring capacitor $C_L$, wherein, however, only the comparison of a single unknown capacitance $C_x$ with a reference capacitance $C_{ref}$ is provided.

WO 2007 025 785 A1 discloses an evaluation circuit for capacitive sensors, wherein two capacitors are compared with each other. For this purpose two RC elements, each comprising one capacitor are supplied in parallel with the same square wave signal wherein their integration times, which due to their capacities are different, are discriminated by use of a XOR phase detector. The resultant square wave signal has a pulse-to-pause ratio which is dependent on the measuring value and is integrated by means of a further RC element so that an analog output signal is obtained. A disadvantage is that the circuit is not adapted for evaluating individual pulses but is only suitable for continuous operation.

AT 403 213 B discloses a similar working capacitive soil moisture sensor in which a time constant which depends on the capacitance to be measured results in a phase distortion of a square wave signal. Here, as a phase detector an AND gate is used, whose output signal is supplied to an RC filter element. The RC filter element converts the square wave signal into an analog signal which is dependent on its pulse-to-pause ratio. A disadvantage is that only one unknown capacitance (sensor electrode) can be measured at a time.

SUMMARY OF THE INVENTION

It is an object of the invention to provide an evaluation circuit for a capacitive sensor which produces a voltage which is detectable by means of an analog-digital converter and is suitable for the evaluation of at least two sensor electrodes.

Moreover, the evaluation circuit should be easy to calibrate and be implementable with a minimum number of electronic components.

The object of the invention is achieved by the characterizing features of claim 1. The dependent claims relate to the advantageous embodiment of the invention.

The essential idea of the present invention is to compare the measuring capacitances successively with the same reference capacitance in a predetermined time regime. To this end, the reference capacitance is connected to the input of a first switching stage and the measuring capacitances are connected to the inputs of further switching stages, wherein these further switching stages are configured, for example, as NAND gates and comprise enable inputs which are controlled by the output of the first switching stage. The outputs of the further switching stages are each connected to the input of an integration stage. A charging capacitor is charged via the outputs of the integration stages, which may also act as current sources. The time length of the output pulses generated from the switching stages determines the voltage of the charging capacitor.

In an advantageous embodiment the reference capacitance is connected to a calibration unit which comprises at least a resistor, a capacitor and a voltage source or is connected to a controllable voltage source. The calibration unit is used both to improve the measurement accuracy by targeted manipulation of the delay time generated by the reference capacitance and to temporally optimize the measurement.

The advantage of the invention is that instead of at least two calibration units only a single one is required. Thus, for example, a capacitive sensor with 3 sensor electrodes can be constructed by only one IC of the type 74HC132, which on the one hand leads to a saving of components and on the other hand improves the measurement accuracy.

The invention will be explained in more detail with reference to the drawings.

DETAILED DESCRIPTION

Figure 1:
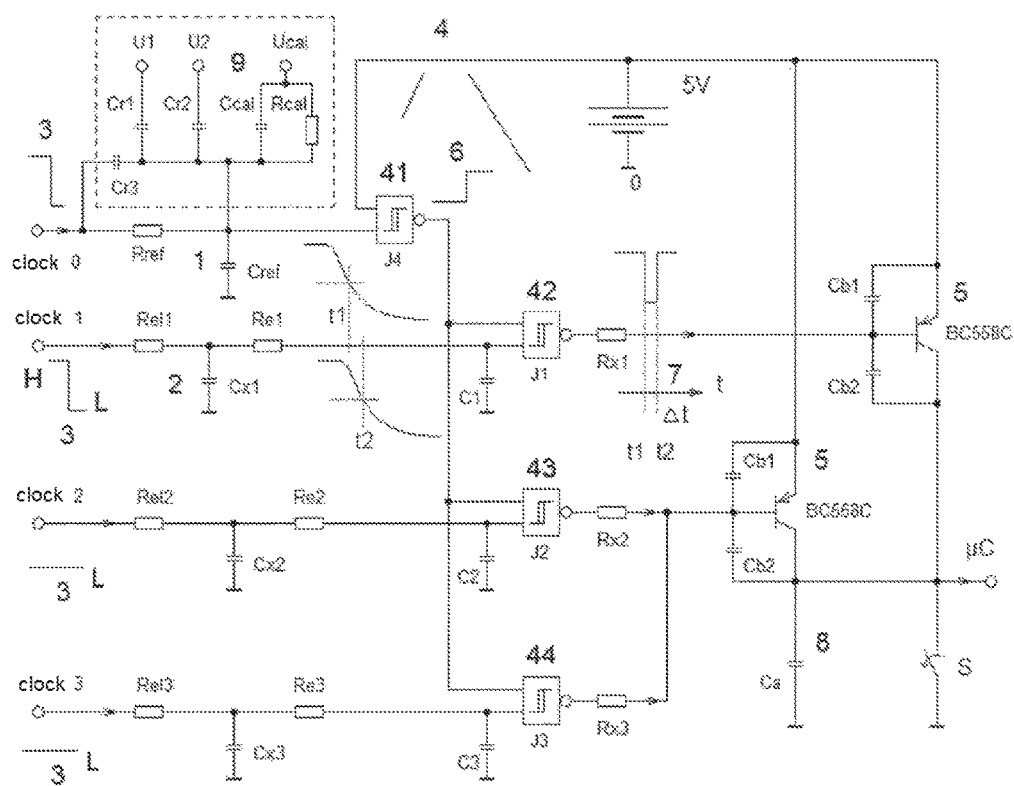
FIG. 1 shows an evaluation circuit according to the invention comprising 3 sensor electrodes.

FIG. 1 shows an exemplary embodiment comprising an integrated circuit of the type 74HC132 with a total of four switching stages 4 (NAND gates), wherein in the rest state, the controllable gate input of the switching stage indicated with 41 is at the logic state "High" so that its output assumes the logic state "Low". This has the consequence that for the duration of this state the switching stages 42, 43, 44 have their inputs which are not externally controllable at the logic state "Low", too, and thus are signally locked, such that their outputs are at the logic state "High" for the duration of this signal state and the integration stages 5 are also locked and the charging capacitor $C_a$ indicated by reference symbol 8, which previously has been discharged via the switch S under the control of the abovementioned microcontroller μC, remains discharged.

The control input of the switching stage 41 which is not connected to the operating voltage is connected to a calibration unit which in addition to $R_{ref}$ and $C_{ref}$ has a calibration resistor $R_{cal}$ and a capacitor $C_{cal}$. In addition, two auxiliary power sources $U_1$ and $U_2$ are connected via the capacitors $C_{r1}$ and $C_{r2}$.

In the rest state one of the clock inputs clock 1, clock 2, clock 3 is at "High" and the other two clock inputs are at "Low". Thus, the switching stage 42 whose clock input is "High" is prepared for pulse generation, while the other two clock inputs still remain locked by means of the logic input signal "Low" during this pulse generation.

In order to generate a pulse at one of the outputs of the switching stages 42, 43, 44 by means of an externally connected control unit (not shown), e.g. a microcontroller (μC), both the clock input "clock 0" and the clock input set at "High" of the clock inputs clock 1, clock 2, clock 3 are simultaneously switched to "Low". Thus, the signal applied to "clock 0" is supplied via the low pass $R_{ref}$, $C_{ref}$ to the input of the respective NAND gate 41 and triggers a positive voltage jump at its output when reaching the threshold voltage, wherein the delay time is influenced to a great extent by the calibration unit by means of which the signal at $C_{ref}$ can be shifted in time and be influenced in its course. To this end, the voltage $U_{cal}$ and the auxiliary voltages $U_1$ and $U_2$ are applied. These voltages and also the four shown clock signals (clock 0, clock 1, clock 2, clock 3) may be generated by means of the control unit (μC) described above.

For a reasonable pulse generation all time constants and all control signals which signally lie before the gate inputs of the gates 41 and 42, 43, 44 are dimensioned or set such that at first the voltage at the gate input of the gate 41 reaches its negative switching threshold. This causes the logic states at all gate inputs of the gates 42, 43, 44, which are inaccessible from the outside, to change from "Low" to "High", such that, as shown, the gate 42 having its input which is accessible from the outside set to the logic state "High" switches its output to "Low" and thus triggers an integration stage 5 connected downstream. Thus, a charging operation of the capacitor $C_a$ designated with 8 is started via one of the integration stages 5. The other two gates 43 and 44 in which the inputs accessible from the outside continue to be "Low" thus remain signally locked.

Thereafter, the voltage at the gate input accessible from the outside whose clock input is switched from "High" to "Low" simultaneously with the signal "clock 0" reaches its negative switching threshold such that the gate output which has just been switched from "High" to "Low" is again switched back to "High" and thus the triggering of the integration stage 5 connected downstream is again interrupted such that the charging operation of the capacitor $C_a$ designated with 8 is terminated.

Thus, upon reaching the threshold voltage of a first switching stage 41 a start signal and upon reaching the threshold voltage of a second switching stage 42, 43, 44 a stop signal is generated.

The reference capacitance 1 is connected to a calibration unit 9 for a targeted modification of the delay time generated by the reference capacitance 1, wherein the calibration unit 9 comprises at least a resistance $R_{cal}$, a capacitor $C_{cal}$ and a voltage source $U_{cal}$ controllable by the evaluation unit (μC).

Thus, the duration of the triggering of the integration stages 5 is dependent on the electrode capacitance to be measured, which is associated to the respective activated clock input (clock 1, clock 2, clock 3). For the evaluation of any capacitance to be measured the respectively associated clock input is triggered in the manner described above.

Figure 2:
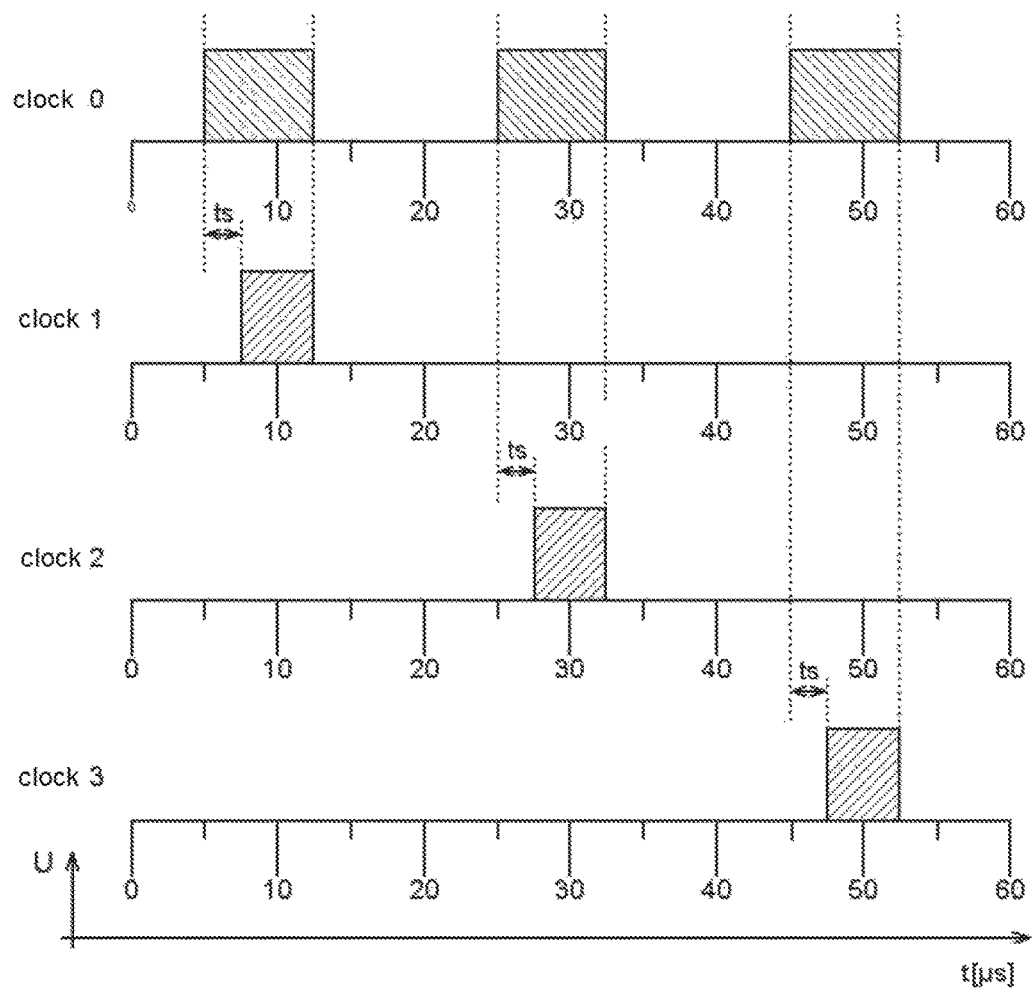
FIG. 2 shows the pulse diagram for controlling the measurement in detail.

FIG. 2 shows the corresponding timing diagram in detail. The signals correspond to the clocks of FIG. 1. Here, the time-delayed clocks 2 and 3 intended for the gates 43 and 44 not shown in FIG. 1 can be seen.

The time span indicated with "ts" is used to create a defined initial state and must be at least as large as the sum of all delay times that could affect the electrical potential in the relevant capacitances and thus ensures a reproducible measurement sequence.

REFERENCE SYMBOLS

1 Reference capacitance,
2 Measuring capacitance(s), measuring electrode(s)
3 Square wave voltage, clock signal
4 Switching stages (41, 42, 43, 44): NAND gate 74HC132 with Schmitt Trigger
5 Integration stage (bipolar Miller integrator or current source)
6 Control signal for the gate inputs (42, 43, 44) inaccessible from the outside
7 Pulse duration (Δt) which represents the measured value
8 Charging capacitor, integration capacitor
9 Calibration unit consisting of $R_{cal}$, $C_{cal}$ and $U_{cal}$ (for all measuring electrodes)

The invention claimed is:

1. Evaluation circuit for a capacitive sensor for detecting the distance, speed or position of an object, comprising a reference capacitance and two measuring capacitances, wherein the reference capacitance and the measuring capacitances are supplied with a square wave voltage via a resistor, and with the aid of switching stages a time variable pulse is obtained on each case which pulse is a measure for the respective measuring capacitance, wherein the reference capacitance is connected to the input of a first switching stage and each of the measuring capacitances are connected to a respective input of one of the further switching stages, wherein the further switching stages include enable inputs which are triggered by the output of the first switching stage, wherein the outputs of the further switching stages are respectively connected to the input of the integration stages, wherein a charging capacitor is charged via the outputs of the integration stages, wherein upon reaching the threshold voltage of the first switching stage a start signal and upon reaching the threshold voltage of the respective further switching stage a stop signal is generated.

2. Evaluation circuit for a capacitive sensor according to claim 1, characterized in that the reference capacitance is connected to a calibration unit for a targeted modification of the delay time produced by the reference capacitance, wherein the calibration unit comprises at least a resistor, a capacitor and a voltage source controllable by the evaluation unit μC.

3. Capacitive sensor comprising an evaluation circuit for detecting the distance, speed or position of an object, comprising a reference capacitance and two measuring capacitances, wherein the reference capacitance and the measuring capacitances are supplied with a square wave voltage via a resistor, and with the aid of switching stage a time variable pulse is obtained on each case which pulse is a measure for the respective measuring capacitance, wherein the reference capacitance is connected to the input of a first switching stage and each of the measuring capacitances are connected to a respective input of one of the further switching stages, wherein the further switching stages include enable inputs which are triggered by the output of the first switching stage, wherein the outputs of the further switching stages are respectively connected to the input of the integration stages, wherein a charging capacitor is charged via the outputs of the integration stages, wherein upon reaching the threshold voltage of the first switching stage a start signal and upon reaching the threshold voltage of the respective further switching stage a stop signal is generated.

4. Actuator in a motor vehicle comprising a capacitive sensor comprising an evaluation circuit for detecting the distance, speed or position of an object, comprising a reference capacitance and two measuring capacitances, wherein the reference capacitance and the measuring capacitances are supplied with a square wave voltage via a resistor, and with the aid of a switching stages a time variable pulse is obtained one each case which pulse is a measure for the respective measuring capacitance, wherein the reference capacitance is connected to the input of a first switching stage and each of the measuring capacitances are connected to a respective inputs of one of the further switching stages, wherein the further switching stages include enable inputs which are triggered by the output of the first switching stage, wherein the outputs of the further switching stages are respectively connected to the input of the integration stages, wherein a charging capacitor is charged via the outputs of the integration stages, wherein upon reaching the threshold voltage of a the first switching stage a start signal and upon reaching the threshold voltage of the respective further switching stage a stop signal is generated.

5. Actuator for a motor vehicle according to claim 4 for actuating a door handle.

\* \* \* \* \*